United States Patent

Ballard et al.

Patent Number: 6,086,946
Date of Patent: Jul. 11, 2000

[54] METHOD FOR ELECTROLESS GOLD DEPOSITION IN THE PRESENCE OF A PALLADIUM SEEDER AND ARTICLE PRODUCED THEREBY

[75] Inventors: Gerald L. Ballard, Wake Forest, N.C.; Robert D. Edwards, Endicott, N.Y.; John G. Gaudiello, Poughkeepsie, N.Y.; Voya R. Markovich, Endwell, N.Y.

[73] Assignee: International Business Machines Corporation, Armonk, N.Y.

[21] Appl. No.: 08/998,405

[22] Filed: Dec. 24, 1997

Related U.S. Application Data

[63] Continuation-in-part of application No. 08/700,627, Aug. 8, 1996, abandoned.

[51] Int. Cl.$^7$ ........................................ B05D 5/12
[52] U.S. Cl. ..................... 427/98; 427/125; 427/304; 427/328; 427/354; 427/405; 427/437; 427/443.1
[58] Field of Search .......................... 427/98, 125, 437, 427/443.1, 301, 304, 328, 353, 354, 405

[56] References Cited

U.S. PATENT DOCUMENTS

| | | | |
|---|---|---|---|
| 3,011,920 | 12/1961 | Shipley, Jr. | 117/213 |
| 3,162,512 | 12/1964 | Robinson | 29/199 |
| 3,396,042 | 8/1968 | Duva | 106/1 |
| 3,468,676 | 9/1969 | Schneble, Jr. et al. | 106/1 |
| 3,562,038 | 2/1971 | Shipley, Jr. et al. | 156/3 |
| 4,027,055 | 5/1977 | Schneble, Jr. | 427/98 |
| 4,305,975 | 12/1981 | Ikari et al. | 427/97 |
| 4,337,091 | 6/1982 | El-Shazly et al. | 106/1.23 |
| 4,574,094 | 3/1986 | DeLuca et al. | 427/96 |
| 4,863,758 | 9/1989 | Rhodenizer | 427/97 |
| 4,869,930 | 9/1989 | Clarke et al. | 427/252 |
| 5,167,992 | 12/1992 | Lin et al. | 427/437 |
| 5,213,841 | 5/1993 | Gulla et al. | 427/98 |
| 5,380,560 | 1/1995 | Kaja et al. | 427/306 |

*Primary Examiner*—Brian K. Talbot
*Attorney, Agent, or Firm*—Pollock, Vande Sande & Amernick; Lawrence R. Fraley

[57] ABSTRACT

Gold is deposited on a copper base defining electrical circuit features disposed on a substrate containing a palladium seeder, by initially treating the substrate with an alkaline cleaner, followed by treating the substrate with sodium persulfate, and subsequently treating the substrate with a diluted sulfuric acid solution. The substrate is rinsed between each one of the treatments, and after the final rinse following treatment with diluted sulfuric acid, the substrate is immersed in a gold deposition solution whereby gold is deposited on the exposed surfaces of the copper circuit features on a substrate. The process embodying the present invention provides a method for depositing gold on high density copper conductor lines or pads, even in areas of the surface in which the conductors are spaced apart 2.0 mil or less, without cleaning or removing the palladium seed from the surface.

14 Claims, 1 Drawing Sheet

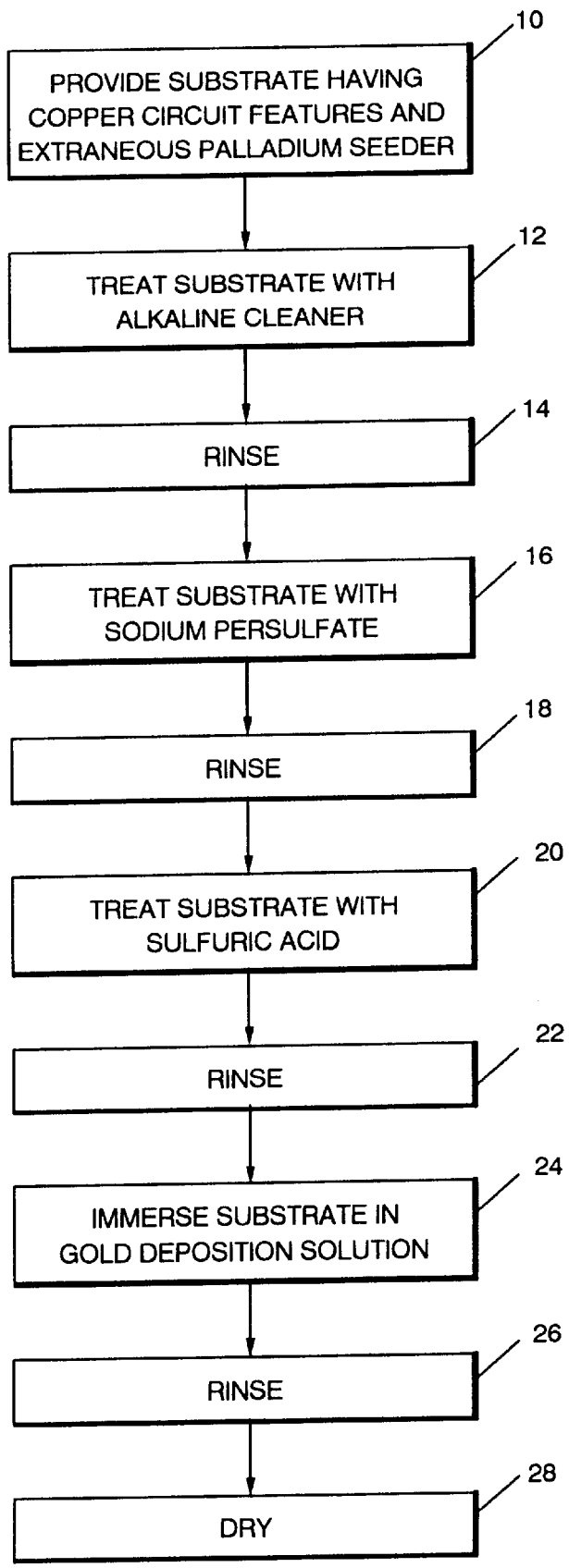

METHOD FOR ELECTROLESS GOLD DEPOSITION IN THE PRESENCE OF A PALLADIUM SEEDER AND ARTICLE PRODUCED THEREBY

This application is a continuation-in-part of Ser. No. 08/700,627, filed Aug. 8, 1996 now abandoned.

FIELD OF THE INVENTION

This invention relates generally to a method for forming a thin coating of gold on a copper base via electroless deposition, and more particularly to such a method for electroless gold deposition on a copper base which was formed by an additive process using a palladium seeder to initiate formation of the copper base.

BACKGROUND OF THE INVENTION

As electronic circuit packaging performance increases, the demand for higher wiring and component density also increases. To meet the higher density requirements, surface mount technology (SMT), such as flip chip attach (FCA), direct chip attach (DCA), ball grid array(BGA), and similar technology is required. In most cases, the copper interconnecting pads have to be contamination and oxidation free to achieve adequate wetability.

In order to achieve adequate wetting and prevent corrosion of the copper pads during application of conductive epoxy, it is necessary to deposit a thin gold overlay onto the copper base. Typically, a thin nickel interlayer is required between the copper and gold overlay to assure adequate bonding of the gold overlay to the underlying copper surface.

However, when the circuit features on the substrates are fabricated by the full additive process, conventional electroless gold deposition causes bridging between the lines and/or pads defining the electrical circuit features on the substrate, that may be spaced apart on the order of about 2 mil or less. The fully additive process used to define the copper features relies on having a palladium catalyst on the surface to be plated. This is provided by seeding the surface with a suitable palladium seeder such as palladium chloride. Heretofore, if the primary catalyst is not removed prior to gold conformal plating, gold will plate on the substrate and form shorts bridging between the conductive copper features. It is very difficult to remove the plating seed layer from between closely spaced electrically conductive features.

The present invention is directed to overcoming the problems set forth above. It is desirable to have an effective gold deposition process by which gold may be directly deposited on the exposed surface of previously defined closely spaced copper electronic circuit features, without the need for a nickel surface, and which avoids bridging of gold between conductive circuit features. It is also desirable to have an economical process for forming a thin gold coating on previously defined closely spaced copper circuit features formed by the fully additive process, which does not require removal of the palladium seeder prior to deposition of the gold coating.

SUMMARY OF THE INVENTION

In accordance with one aspect of the present invention, a method for electroless gold deposition in the presence of a palladium seeder includes providing a substrate having copper circuit features that were formed on the substrate by a full additive process employing a palladium catalyst to initiate the formation of the copper circuit features on the substrate. The substrate is treated with an alkaline cleaner, rinsed, and then treated with sodium persulfate, again rinsed, and treated with dilute sulfuric acid. After treatment with the sulfuric acid, the substrate is again rinsed and then immersed in a gold deposition solution. After immersion of the substrate in the gold deposition solution, whereby gold is deposited on the exposed surfaces of the copper circuit features disposed on the substrate, the substrate is rinsed and dried.

Other features of the method for electroless gold deposition in the presence of a palladium seeder, in accordance with the present invention, includes carrying out the steps of treating the substrate with an alkaline cleaner, with sodium persulfate, and diluted sulfuric acid, by immersion in a respective bath containing said materials for a period of about one minute. Other features include, in the subsequently carried out steps of rinsing after each of the above described treatments, rinsing the substrate in a flowing stream of deionized water for about two minutes. Still other features include heating the gold deposition solution to a temperature of about 85° C. and immersing the substrate in the solution for about 10 to 15 minutes, or alternatively, for a period of time sufficient to form a gold coating having a thickness of from about 5,000 Å to about 15,000 Å.

In accordance with another aspect of the present invention, an electronic circuit board has a dielectric substrate and a plurality of electric circuit features formed on the substrate. The copper circuit features are formed by an additive process in which sharply defined edges are formed between substantially planar surfaces and sides of the features by using a catalyst material having palladium as a primary component to initiate the formation of the copper circuit features on the substrate. The electronic circuit board has detectable amounts of the palladium catalyst on the sides of the copper circuit features over which a layer of gold is conformally deposited, in direct contact with the surface and sides of the copper circuit features.

Other features include the layer of gold having a thickness of from about 5,000 Å to about 15,000 Å. The electronic circuit board is further characterized by the absence of a gold interlayer between the copper circuit features and the gold layer.

BRIEF DESCRIPTION OF THE DRAWING

The sole drawing figure is a flow chart outlining the principal steps carried out in the method for electroless gold deposition, in accordance with the present invention.

DETAILED DESCRIPTION OF A PRESENTLY PREFERRED EXEMPLARY EMBODIMENT

Advantageously, the present invention provides a method for conformal plating of gold onto a copper base by conventional electroless plating methods, without the need for a nickel interlayer between the copper base and gold ovelayer, or requiring the removal of palladium seeder from the surface of the substrate. The method defined by the present invention is especially desirable when the space between electrical conductive features on the substrate is very narrow, for example, on the order of 2 mils or less. The term "substrate"as used herein, means thermoset or thermoplastic dielectric base members, typically laminated, on which a plurality of electrical circuit features are formed on an external surface of the member. Examples of such substrates include printed wiring boards (PWB), printed circuit boards (PCB), chip carriers, and like structures. The term "electrical circuit features" as used herein, means electrically conductive pads, contacts, filled through holes, lands, and chip connection sites that are formed on an external surface of the substrate by a fully additive process.

The initial step in the method for electroless gold deposition in the presence of a palladium seeder is providing a substrate on which copper circuit features are formed by a process, e.g., a fully additive process, in which a catalyst material, having palladium as its primary component, was used to initiate the formation of the copper circuit features on the substrate. Fully additive processes form circuit features having sharply defined edges between substantially planar surfaces and the sides of the formed features. In such processes, extraneous palladium seeder, e.g., palladium chloride, remains on the substrate in the areas between the defined copper features and on the sides of the copper circuit features. This initial step of the process is represented by block 10 in the flow chart comprising the sole drawing figure.

The substrate is initially treated with an alkaline cleaner, such as Alconex manufactured by Alconex Inc., New York, N.Y., as indicated at block 12. Desirably, the substrate is immersed in a bath containing the alkaline cleaner for about one minute, and then subsequently rinsed in a running stream of deionized water for a period of about two minutes, as represented by block 14.

After cleaning with an alkaline cleaner and rinsing, the substrate is then treated with sodium persulfate as represented at block 16, by immersion in a bath containing about a 10% solution of sodium persulfate for one minute. After the sodium persulfate treatment, the substrate is again rinsed in a stream of deionized water for about two minutes, as indicated at block 18.

Following the sodium persulfate treatment, the substrate is then subjected to diluted sulfuric acid for about one minute, as indicated at block 20. In this step, the substrate is immersed in a bath containing about 2% sulfuric acid, for about one minute, and then rinsed in a running stream of deionized water for about two minutes, as represented at block 22.

The above-described cleaning, sodium persulfate treatment, and sulfuric acid treatment steps effectively neutralize the extraneous palladium seeder material on the surface of the substrate, enabling the electroless plating of a thin, conforming, gold layer, for example, on the order of from about 5,000 Å to about 15,000 Å, on each of the exposed surfaces of the copper features on the substrate, without bridging across closely spaced features. In the process embodying the present invention, a gold overlay is formed over the copper circuit features in which the sides of the copper circuit features have detectable amounts of the palladium catalyst. Advantageously, the conformal plating of gold on the copper surfaces may be carried out by a conventional electroless plating process, as represented at block 24. Preferably, the substrate is immersed in a conventional gold deposition solution, such as Immersion Gold I-62, manufactured by Applied Electroless Concepts, El Toro, Calif. Desirably, the immersion gold I-62 solution is heated to a temperature of about 85° C. to enhance the rate at which gold is formed. The substrate is typically immersed in the solution for about 10 to 15 minutes, a time generally sufficient to build a thin coating of gold on the copper features to a thickness of from about 5,000 Å to about 15,000 Å. After formation of the gold overlay on the copper base, the substrate is rinsed by placing the substrate in a running stream of deionized water for about two minutes, as indicated at block 26, after which the substrate is air-dried as represented at block 28.

The method of electroless gold deposition embodying the present invention, thus provides a printed circuit board that has electrical circuit features formed thereon by a fully additive process, and is further characterized by the absence of a nickel interlayer between the formed copper features and a gold overlay. The gold overlay is deposited directly onto the copper features by electroless gold deposition. Importantly, the palladium seed is not removed from the board prior to deposition of the gold overlay. Thus, the formed circuit board is uniquely characterized by the presence of small amounts of palladium seed remaining on the side walls of the copper features formed by the fully additive process and by the absence of a nickel interlayer between the copper base and gold overlay. Moreover, the formed circuit board may have densely distributed conductive features with clearances as small as 2 mils between adjacent conductive features.

The above-described method for electroless gold deposition in the presence of a palladium seeder also provides an effective method of depositing gold on copper conductors without requiring nickel to be initially deposited on the copper to provide a base for the gold. Furthermore, the method provides a method of depositing gold onto printed circuit boards manufactured by fully additive processes without removing the palladium/tin seed and without bridging between closely spaced features on the board. Advantageously, the present invention also provides a method for conformal gold deposition without requiring the prior removal of palladium/tin seed from the surface of the substrate.

Other aspects, features, and advantages of the present invention may be obtained from a study of this disclosure and the drawings, along with the appended claims.

What is claimed is:

1. A method for electroless gold deposition, comprising:
   providing a substrate;
   forming copper circuit features on said substrate by an additive process employing a catalyst material having palladium, wherein the palladium is a primary component to initiate the deposition of copper on said substrate;
   treating said substrate with an alkaline cleaner;
   rinsing said substrate subsequent to said treatment with an alkaline cleaner;
   treating said rinsed substrate with sodium persulfate;
   rinsing said substrate subsequent to said sodium persulfate treatment;
   treating said rinsed substrate with diluted sulfuric acid;
   rinsing said substrate subsequent to said diluted sulfuric acid treatment;
   immersing said rinsed substrate in a gold deposition solution whereby gold is directly deposited on exposed surfaces of the copper circuit features in the presence of detectable amounts of said palladium catalyst on said sides of the copper circuit features;
   rinsing said substrate subsequent to immersion in said gold deposition solution; and
   drying said rinsed substrate.

2. The method of claim 1 wherein spacing between copper circuit features is about 2 mil or less.

3. The method of claim 1 wherein the gold is deposited to provide a thickness of about 5,000 Å to about 15,000 Å.

4. The method of claim 1 wherein the dilute sulfuric acid comprises about 2% sulfuric acid.

5. A method for electroless gold deposition, as set forth in claim 1, wherein treating said substrate with an alkaline cleaner includes immersing said substrate in a bath containing said alkaline cleaner for about 1.0 minute.

6. A method for electroless gold deposition, as set forth in claim 1, wherein rinsing said substrate subsequent to said treatment with an alkaline cleaner includes rinsing said substrate in a flowing stream of deionized water for about 2.0 minutes.

7. A method for electroless gold deposition, as set forth in claim 1, wherein treating said rinsed substrate with sodium persulfate includes immersing said substrate in a bath consisting of about 10% sodium persulfate for about 1.0 minute.

8. A method for electroless gold deposition, as set forth in claim 1, wherein rinsing said substrate subsequent to said sodium persulfate treatment includes rinsing said substrate in a flowing stream of deionized water for about 2.0 minutes.

9. A method for electroless gold deposition, as set forth in claim 1, wherein treating said substrate with diluted sulfuric acid, includes immersing said substrate in a bath consisting of about 2% sulfuric acid for about 1.0 minute.

10. A method for electroless gold deposition, as set forth in claim 1, wherein rinsing said substrate subsequent to treatment with diluted sulfuric acid includes rinsing said substrate in a flowing stream of deionized water for about two minutes.

11. A method for electroless gold deposition, as set forth in claim 1, wherein immersing said rinsed substrate in a gold deposition solution includes heating said gold deposition solution to a temperature of about 85° C. and immersing said substrate in said heated gold deposition solution for from about 10 to about 15 minutes.

12. A method for electroless gold deposition, as set forth in claim 1, wherein immersing said rinsed substrate in a gold deposition solution includes heating said gold deposition solution to a temperature of about 85° C. and immersing said substrate in said heated gold deposition solution for a period of time sufficient to form a conformal coating of gold on the exposed copper surfaces of said copper features having a thickness of from about 5,000 Å to about 15,000 Å.

13. A method for electroless gold deposition, as set forth in claim 1, wherein said rinsing said substrate subsequent to immersion in said gold deposition solution includes rinsing said substrate in a flowing stream of deionized water for about 2.0 minutes.

14. A method for electroless gold deposition, as set forth in claim 1, wherein said drying said rinsed substrate includes drying said substrate in air.

* * * * *